(12) United States Patent  
Bopp

(10) Patent No.: US 9,167,734 B2
(45) Date of Patent: Oct. 20, 2015

(54) CIRCUIT BOARD AND CONNECTOR SHIELDING APPARATUS

(71) Applicant: Raytheon Company, Waltham, MA (US)

(72) Inventor: Jayson Kahle Bopp, Fishers, IN (US)

(73) Assignee: RAYTHEON COMPANY, Waltham, MA (US)

( * ) Notice: Subject to any disclaimer, the term of this patent is extended or adjusted under 35 U.S.C. 154(b) by 92 days.

(21) Appl. No.: 13/958,216

(22) Filed: Aug. 2, 2013

(65) Prior Publication Data

US 2015/0038014 A1 Feb. 5, 2015

(51) Int. Cl.
*H01R 13/648* (2006.01)
*H05K 9/00* (2006.01)
*H05K 7/14* (2006.01)

(52) U.S. Cl.
CPC .............. *H05K 9/0022* (2013.01); *H05K 7/142* (2013.01); *H05K 9/0018* (2013.01)

(58) Field of Classification Search
USPC ......... 439/607.35, 607.36, 88, 607.02, 607.4, 439/607.07–607.1, 607.13, 607.18–607.23, 439/607.03, 607.09, 564, 573, 844, 854
See application file for complete search history.

(56) References Cited

U.S. PATENT DOCUMENTS

| | | | |
|---|---|---|---|
| 4,518,209 A | 5/1985 | Negley | |
| 4,842,552 A | 6/1989 | Frantz | |
| 4,929,185 A * | 5/1990 | Wong et al. | 439/74 |
| 5,251,149 A * | 10/1993 | Williams et al. | 702/46 |
| 5,259,772 A * | 11/1993 | Fusselman et al. | 439/108 |
| 5,266,052 A | 11/1993 | Phillips, II | |
| 5,304,964 A * | 4/1994 | DiMarco | 333/181 |
| 6,090,728 A | 7/2000 | Yenni, Jr. | |
| 8,197,285 B2 * | 6/2012 | Farmer | 439/607.35 |
| 8,294,043 B2 * | 10/2012 | Munoz et al. | 174/359 |
| 2002/0098725 A1 | 7/2002 | Wallace | |
| 2004/0238195 A1 | 12/2004 | Thompson | |
| 2005/0148218 A1 * | 7/2005 | Fang et al. | 439/79 |

OTHER PUBLICATIONS

Search Report issued in PCT/US2014/039898 on Sep. 29, 2014; 7 pages.
Written Opinion issued in PCT/US2014/039898 on Sep. 29, 2014; 4 pages.

* cited by examiner

*Primary Examiner* — Abdullah Riyami
*Assistant Examiner* — Harshad Patel
(74) *Attorney, Agent, or Firm* — Cantor Colburn LLP

(57) ABSTRACT

A shielding apparatus connectable between a circuit board and a connector having pins connectable to the circuit board is provided. The shielding apparatus includes a wall element defining opposite sides and connection locations respectively connectable with the connector and the circuit board and is configured as an electro-magnetic interference skirt to block radiation emanating from and receivable by the pins.

12 Claims, 7 Drawing Sheets

CIRCUIT BOARD AND CONNECTOR SHIELDING APPARATUS

BACKGROUND

The present invention relates to a shielding apparatus and, more particularly, to a shielding apparatus connectable between a circuit board and a connector having pins connectable to the circuit board.

Many military and non-military electronic products require circular connectors as rugged external interfaces to interface with other devices. To minimize cabling and assembly costs of these products, the connectors are often attached directly to printed circuit boards (PCBs). Due to the soldering process, however, a gap is frequently left between the metal back of the connector and the PCB. The PCB is often designed to block this electro-magnetic interference (EMI), but the gap still allows all the short exposed pins to act as receiving and transmitting antennae. This causes test failures and can interfere with the proper operation of the products (or adjacent products).

The problem of the gap between the PCB and the metal back of the connector has been traditionally solved by physically quarantining the connector PCB in a separate metal housing. This can work in some applications but is often a bulky, heavy and expensive solution. Other options involve placing small metal canisters around the connectors themselves. This is done with very thin sheet metal that is soldered into place. Such canisters can be an effective EMI barrier but still require that the connector be mechanically mounted to the PCB.

SUMMARY

According to one embodiment of the present invention, a shielding apparatus connectable between a circuit board and a connector having pins connectable to the circuit board is provided. The shielding apparatus includes a wall element defining opposite sides and connection locations respectively connectable with the connector and the circuit board and is configured as an electro-magnetic interference skirt to block radiation emanating from and receivable by the pins.

According to another embodiment, a shielding apparatus connectable between a circuit board and a connector having pins connectable to the circuit board is provided. The shielding apparatus includes a wall element defining opposite sides and connection locations respectively connectable with the connector and the circuit board and being configured to surround the pins in a plane defined transversely with respect to longitudinal axes of the pins.

According to another embodiment, a shielding and mechanical attachment system is provided and includes a connector including a flange and pins protruding in a protrusion dimension from a plane of the flange, a circuit board to which the pins are electrically connectable and a shielding including a wall element defining opposite sides and connection locations respectively connectable with the flange and the circuit board and being configured to surround the pins in a plane defined transversely with respect to the protrusion dimension.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As described below, a shielding apparatus has the ability to physically attach a connector to a PCB and to attach the same connector to a chassis and to provide EMI shielding in a single, low-cost item. The shielding apparatus connects two or more (e.g., 4) standoffs together with a solid wall, creating 360 degree coverage for EMI protection. This attachment of the standoffs together also has the added benefit of preventing the individual standoffs from rotating when being installed or removed. By tying them to each other and pinning them in place, the "shielding" formed by a solid wall is unable to rotate and requires only a driver to install the fasteners. That is, a second tool is not required to hold the standoff still. The shielding apparatus blocks radiation by providing a low-resistance ground path from an outside of the chassis through the connector and into a ground plane on a PCB inside the chassis.

Figure 2:
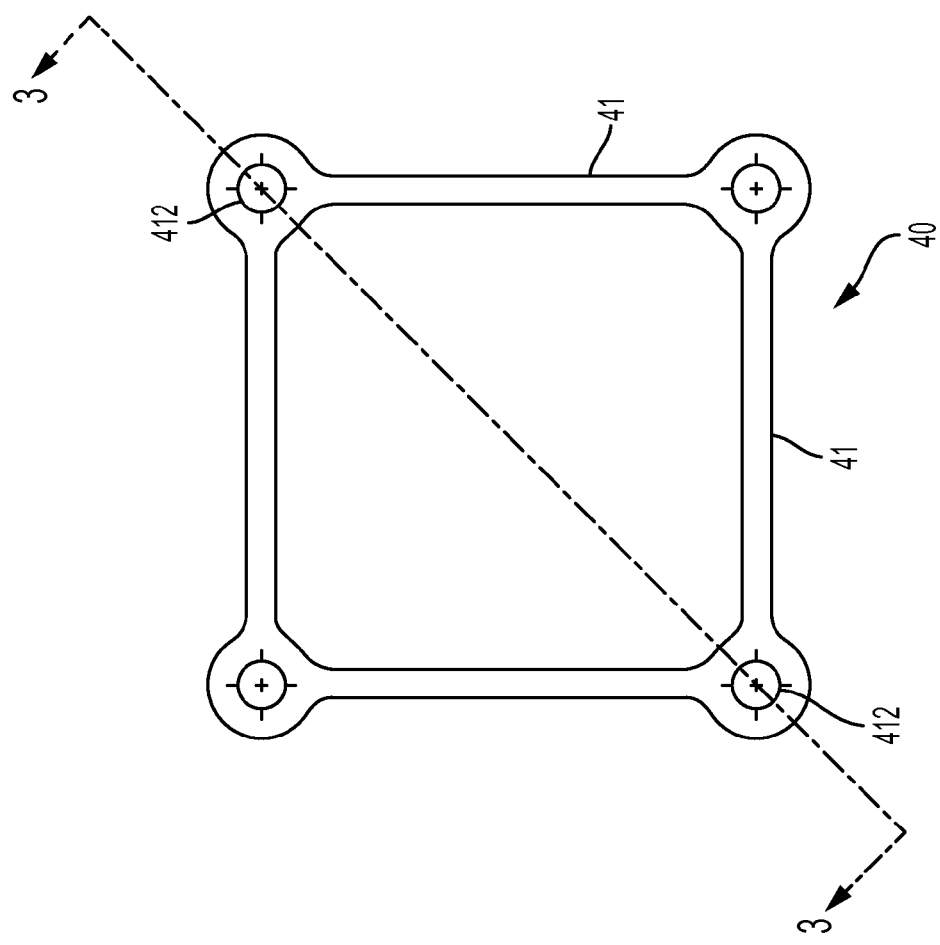
FIG. 2 is an elevational view of a shielding apparatus in accordance with embodiments.
Figure 3:
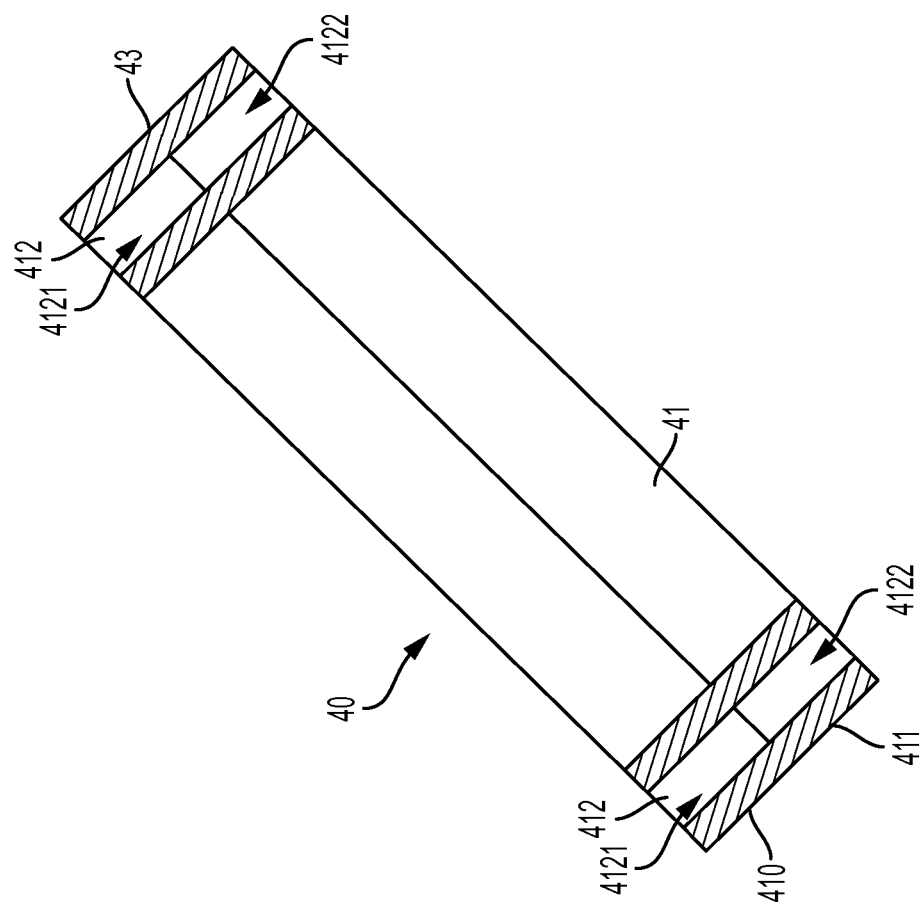
FIG. 3 is a side view of the shielding apparatus of FIG. 2 taken along line 3-3 of FIG. 2.
Figure 4:
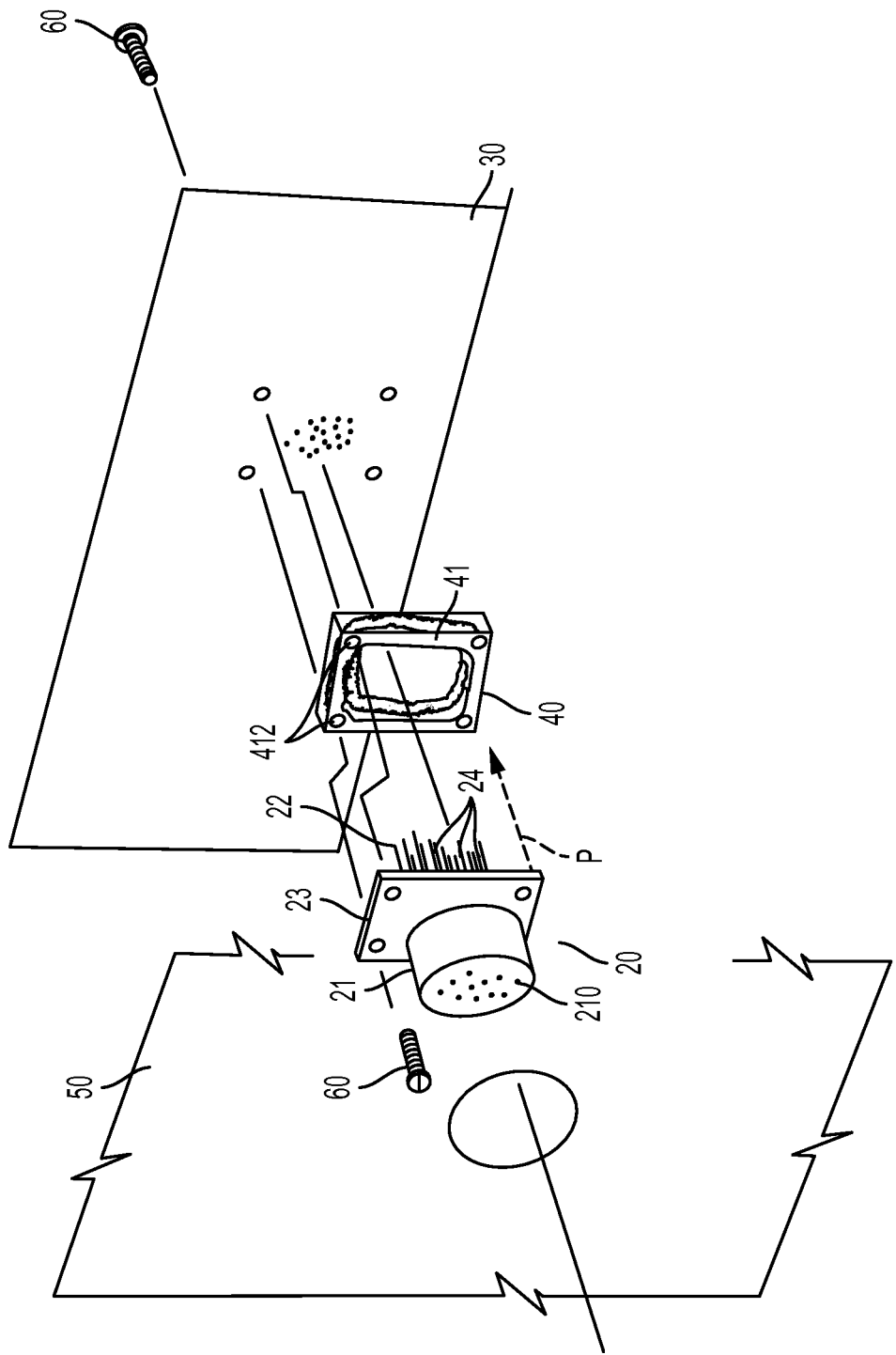
FIG. 4 is an exploded view of an assembly of the system of FIG. 1 in accordance with embodiments.

With reference to FIGS. 1-4, a shielding and mechanical attachment system 10 is provided. The system 10 includes a connector 20, a circuit board 30, shielding 40 and a chassis 50. The connector 20 may be, but is not required to be, provided as a MIL-DTL-38999 compatible connector and includes a first side 21, a second side 22, a flange 23 that divides the first side 21 from the second side 22 and pins 24 (see FIG. 4). The first side 21 includes a connector element 210 disposed opposite the pins 24 with respect to a plane of the flange. The connector element 210 may be formed to connect with a pin or socket array including a plurality of pins (as shown in FIG. 4) or sockets (see FIG. 1, which only shows one socket for clarity). The flange 23 may be rectangular or substantially square and protrudes radially outwardly beyond the connector element 210. The pins 24 are disposed on the second side 22 and protrude in a protrusion dimension P from the plane of the flange 23.

The circuit board 30 may be any type of circuit or wiring board and may include a flex connection to one or more additional circuit boards 31. The circuit board 30 includes a body 32 having a surface and is formed to define through-holes in the body 32 that line up with the size, quantity and pattern of the pins. When the connector 20 is coupled to the circuit board 30, the pins 24 extend through the body 32 and may be soldered into place from the opposite side. Thus, the pins 24 may be electrically connectable to one or more circuits associated with the circuit board 30. Moreover, the pins 24 may be provided as a bridge whereby an external lead(s) coupled to the connector element 210 can be electrically coupled to the one or more circuits.

The shielding 40 is configured as an electro-magnetic interference skirt disposable between the flange 23 and the surface of the body 32 of the circuit board 30 to block radiation emanating from the pins 24 and to prevent the pins 24 from receiving radiation (e.g., radiation carried away along a cable and re-radiated at another point). The shielding 40 may have a variable width (as defined between the flange 23 and the circuit board 30) in accordance with lengths of the pins 24. The shielding 40 includes a wall element 41, which is formed of electro-magnetic radiation interfering material or a non-shielding material coated with a metallized film. The wall element 41 is formed to define opposite sides 410 and 411 and two or more connection locations 412. The wall element 41 is connectable with the flange 23 and the circuit board 30 at the two or more connection locations 412 and is configured to surround the pins 23 in a plane that is defined transversely with respect to the protrusion dimension P.

Figure 1:
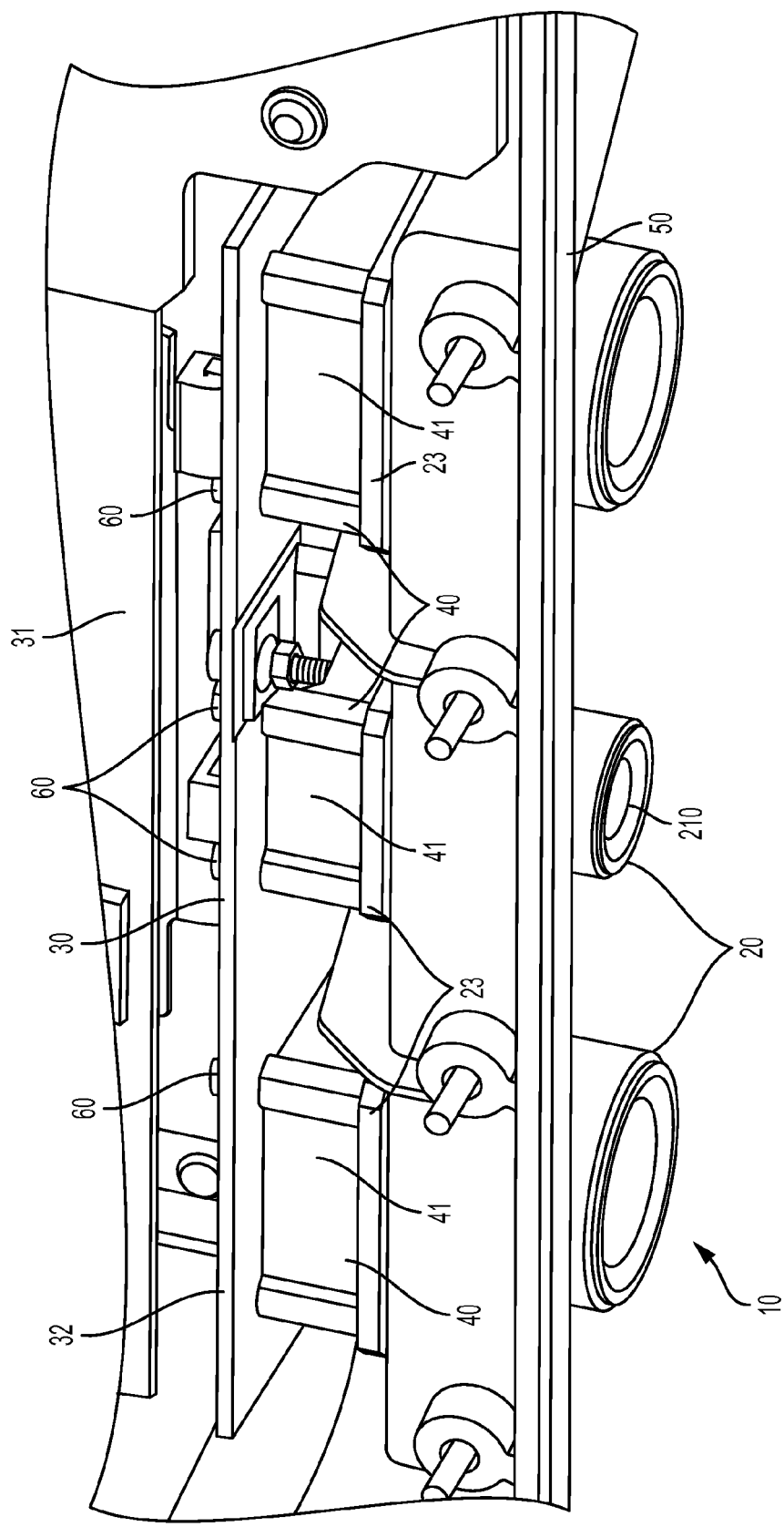
FIG. 1 is a perspective view of a system including a shielding apparatus in accordance with embodiments.

As shown in FIG. 1, the shielding and mechanical attachment system 10 may further include a chassis 50. The chassis 50 may be formed around the connector 20, the circuit board 30 and the shielding 40 such that, for example, only the connector element 210 extends outwardly from a through-hole defined by a wall section of the chassis 50 (see FIG. 4). The chassis 50 may further be formed around the flex connection and the one or more additional circuit boards 31. The chassis 50 may be formed of electro-magnetic radiation interfering material or a non-shielding material coated with a metallized film as with the wall element 41.

Although the shielding 40 is illustrated in FIGS. 1-4 as being rectangular or squared, it is to be understood that the shielding 40 need not have this shape(s). Indeed, the shielding 40 can have any shape as required to surround the pins 24 in the plane that defined transversely with respect to the protrusion dimension P. That is, the shielding 40 may be rectangular, square, circular, elliptical, regular or irregular. For purposes of clarity and brevity, however, the shielding 40 will be described below as a rectangular element with four corners (the most common circular connector is the MIL-DTL-38999/20 series with 8 standard sizes all of which have 4 holes arranged in a square pattern). This embodiment will extend to the connector 20 and the flange 23, which will be described as a similarly rectangular element with four corners corresponding to the four corners of the shielding 40.

As shown in FIGS. 2 and 3, the two or more connection locations 412 may be defined at the four corners of the shielding 40. The two or more connection locations 412 may be divided into first side connection locations 4121, which are associated with the one side 410 and face the connector 20 and second side connection locations 4122, which are associated with the other side 411 and face the surface of the circuit board 30 by a divider 43. The divider 43 may in some cases be an actual structural element, such as a planar sheet dividing the first side connection locations 4121 from the second side connection locations 4122 or a parting line of a die casting. In any case, the two or more connection locations 412 may be provided with appropriate engagement with corresponding screw threading (e.g., internal threading). In this way, the one side 410 of the wall element 41 can be fastened to the flange 23 and the other side 411 of the wall element 41 can be fastened to the circuit board 30 at the two or more connection locations 412.

As shown in FIGS. 1 and 4, one or more screws 60 may be configured to fasten the opposite sides 410, 411 of the wall element 41 to the flange 23 and the circuit board 30 at the two or more connection locations 412. The one or more screws 60 may be oriented in various directions and can be used in various combinations with one another. For example, as shown in FIG. 1, the central shielding 40 has at least two (foreground) screws 60 extending from the circuit board 30 to the wall element 41 while the lateral shieldings 40 each have at least one (foreground) screw 60 extending from the circuit board 30 to the wall element 41. By contrast, as shown in FIG. 4, one screw 60 may extend from the flange 23 to the wall element 41 at one of the connection locations 412 and another screw 60 may extend from the circuit board 30 to the wall element 41 at another one of the connection locations 412. This option of using more or less screws 60 with each individual shielding 40 allows for a wide of connection options for various applications although it is to be understood that not using a full complement of screws may not be ideal as missing screws may reduce shielding effects.

Figure 5:
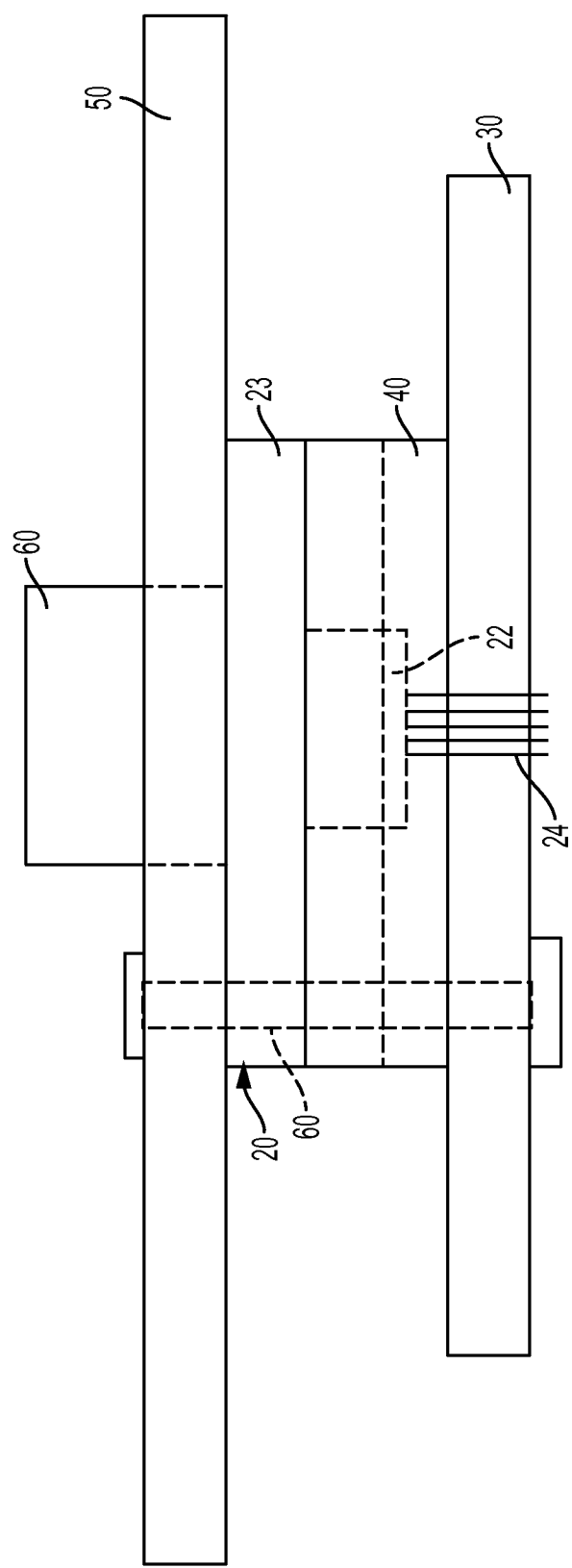
FIG. 5 is a schematic diagram of an alternative connection scheme of the system of FIG. 1.
Figure 6:
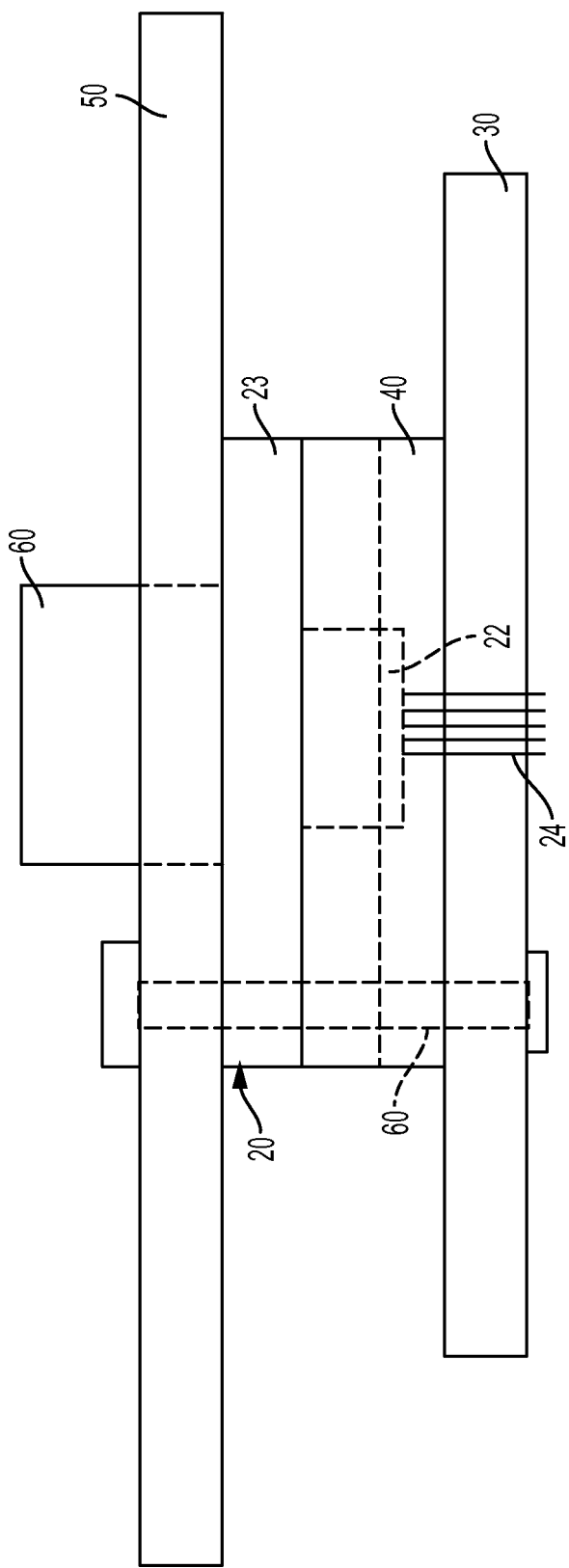
FIG. 6 is a schematic diagram of an alternative connection scheme of the system of FIG. 1.
Figure 7:
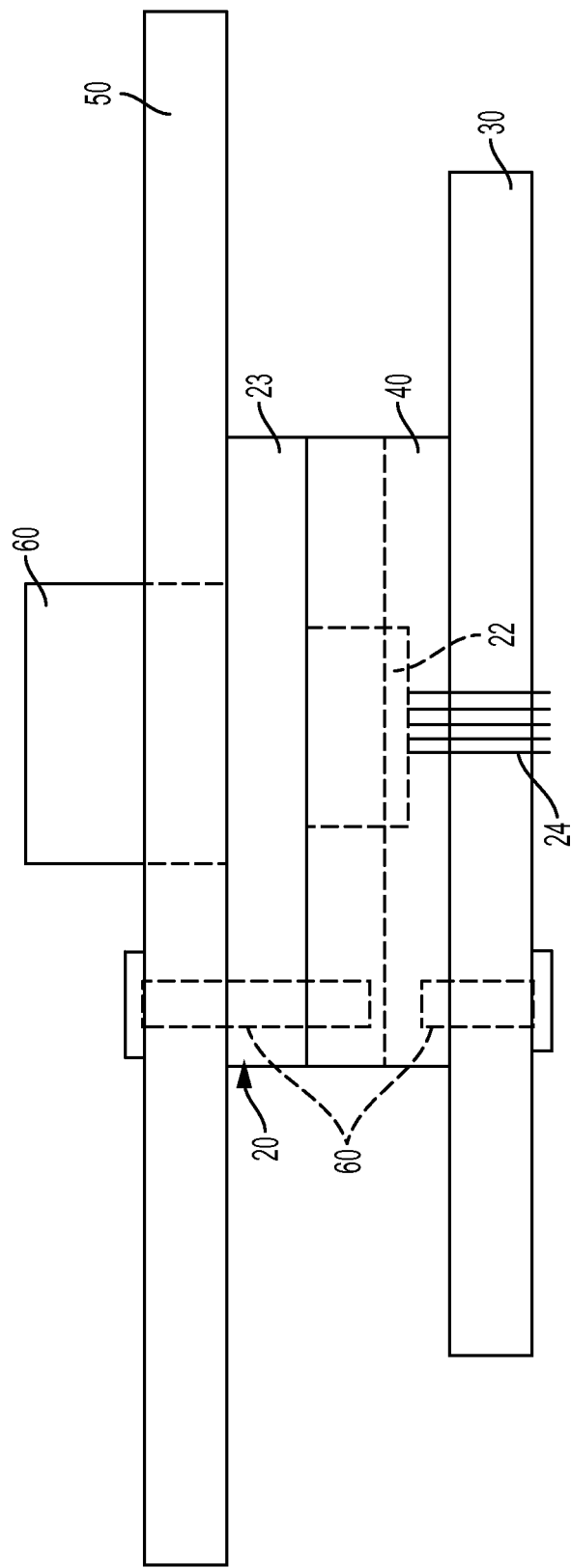
FIG. 7 is a schematic diagram of an alternative connection scheme of the system of FIG. 1.

With reference to FIGS. 5-7, examples of the various screw options are illustrated. As shown in FIGS. 5 and 6, the screws 60 can extend from the circuit board 30, and through the wall element 41 and the connector 20 (see FIG. 5) or the screws 60 can extend from the connector 20 and through the wall element 41 and the circuit board 30 (see FIG. 6). As shown in FIG. 7, multiple screws 60 can share the same connection location 412 with one screw 60 extending from the circuit board 30 into the wall element 41 and another screw extending in the opposite direction from the connector 20 to the wall element 41. Other possible embodiments include those where the pattern of holes for the flange 23 differ from the pattern of holes for the circuit board 30. Generally, the connector 20 and the circuit board 30 have through-holes through which the screws 60 extend and the wall element 41 is the only feature that actually connects to the screws 60.

The connection assembly 10 may further include a driver (not shown) to install the screws 60. In accordance with embodiments, the driver may be a powered or manual tool. In either case, the driver may cause the screw 60 to rotate about longitudinal axes thereof such that the screws 60 engage with the connector 20, the wall element 41 and/or the circuit board 30 to thereby draw these features together.

Since the wall element 41 is rigid or semi-rigid, the engagement (or disengagement) of each of the screws 60 can be achieved without causing the other screws 60 to rotate. Thus, once the wall element 41 is placed proximate to the circuit board 30 and the connector 20, the screws 60 can be initially engaged and then finally and fully engaged by way of the driver 60 without the need for an additional tool to hold the connector 20, the wall element 41, and the circuit board 30 together.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A shielding apparatus connectable between a circuit board and a connector,
the connector comprising:
a flange;
a connector element at a first side of the flange; and
pins at a second side of the flange,
the flange protruding radially outwardly beyond the connector element and the pins being connectable to the circuit board and disposed to protrude from a plane of the flange,
the shielding apparatus comprising:
a wall element defining opposite sides and connection locations, one of the opposite sides being connectable with the flange of the connector at the connection locations and the other of the opposite sides being connectable with the circuit board at the connection locations,
the wall element being configured as an electro-magnetic interference skirt to block radiation emanating from and receivable by the pins; wherein screws are configured to fasten the opposite sides of the wall element to the flange and the circuit board at the connection locations, and wherein the screws comprise a first screw extending from the flange to the wall element and a second screw extending from the circuit board to the wall element, the first and second screws being configured to share a connection location.

2. A shielding apparatus connectable between a circuit board and a connector,
the connector comprising:
a flange;
a connector element at a first side of the flange; and
pins at a second side of the flange,
the flange protruding radially outwardly beyond the connector element and the pins being connectable to the circuit board and disposed to protrude from a plane of the flange,
the shielding apparatus comprising:
a wall element defining opposite sides and connection locations, one of the opposite sides being connectable with a complementary side of the flange of the connector at the connection locations and the other of the opposite sides being connectable with a complementary side of the circuit board at the connection locations such that the respective complementary sides of the flange and the circuit board face each other at a distance,
the wall element being configured to surround the pins in a plane defined transversely with respect to longitudinal axes of the pins; wherein screws are configured to fasten the opposite sides of the wall element to the flange and the circuit board at the connection locations wherein the screws comprise: a first screw extending from the flange to the wall element; and a second screw extending from the circuit board to the wall element; and wherein the first and second screws share a connection location.

3. The shielding according to claim 2, wherein the opposite sides of the wall element are respectively fastened to the flange of the connector and the circuit board at the connection locations.

4. The shielding according to claim 2, wherein the wall element is formed of electro-magnetic radiation interfering material or a material coated with a metallized film.

5. A shielding and mechanical attachment system, comprising:
a connector comprising a flange, a connector element at a first side of the flange and pins at a second side of the flange, the flange protruding radially outwardly beyond the connector element and the pins being disposed to protrude in a protrusion dimension from a plane of the flange;
a circuit board defining through-holes through which the pins extend such that the pins are electrically connectable to an opposite side of the circuit board; and
a shielding comprising:
a wall element defining opposite sides; and
convex connection locations respectively located at corners of the wall element,
one of the opposite sides being connectable with a complementary side of the flange at the connection locations and the other of the opposite sides being connectable with a complementary side of the circuit board at the connection locations such that the respective complementary sides of the flange and the circuit board face each other at a distance,
the wall element and the convex connection locations being configured to surround the pins in a plane defined transversely with respect to the protrusion dimension; wherein screws are configured to fasten the opposite sides of the wall element to the flange and the circuit board at connection locations; the screws comprise: a first screw extending from the flange to the wall element; and a second screw extending from the circuit board to the wall element, wherein the first and second screws share one of the two or more connection locations.

6. The system according to claim 5, wherein the circuit board is disposable within a chassis formed of similar material as the shielding.

7. The system according to claim 5, further comprising additional circuit boards connectable with the circuit board.

8. The system according to claim 5, wherein the connector comprises a connector element opposite the pins with respect to the plane of the flange.

9. The system according to claim 8, wherein the connector element is receptive of a plurality of pins.

10. The system according to claim 8, wherein the connector element is receptive of a plurality of sockets.

11. The system according to claim 5, wherein the opposite sides of the wall element are respectively fastened to the flange and the circuit board at the two or more connection locations.

12. The system according to claim 5, wherein the wall element is formed of electro-magnetic radiation interfering material.

\* \* \* \* \*